(12) United States Patent
Richmond, II et al.

(10) Patent No.: US 7,928,754 B2
(45) Date of Patent: Apr. 19, 2011

(54) WAFER LEVEL BURN-IN AND ELECTRICAL TEST SYSTEM AND METHOD

(75) Inventors: Donald Paul Richmond, II, Palo Alto, CA (US); John Dinh Hoang, San Jose, CA (US); Jerzy Lobacz, San Mateo, CA (US)

(73) Assignee: Aehr Test Systems, Fremont, CA (US)

( * ) Notice: Subject to any disclaimer, the term of this patent is extended or adjusted under 35 U.S.C. 154(b) by 0 days.

(21) Appl. No.: 12/574,447

(22) Filed: Oct. 6, 2009

(65) Prior Publication Data

US 2010/0176836 A1 Jul. 15, 2010

Related U.S. Application Data

(60) Continuation of application No. 10/718,825, filed on Nov. 21, 2003, now Pat. No. 7,619,428, which is a continuation of application No. 09/865,957, filed on May 25, 2001, now Pat. No. 6,682,945, which is a division of application No. 09/353,121, filed on Jul. 14, 1999, now Pat. No. 6,562,636.

(51) Int. Cl.
*G01R 31/02* (2006.01)
(52) U.S. Cl. .................. 324/762.05; 324/750.05
(58) Field of Classification Search .......... 324/754–765; 438/14–17
See application file for complete search history.

(56) References Cited

U.S. PATENT DOCUMENTS 3,530,750 A 9/1970 Daniels
(Continued)

FOREIGN PATENT DOCUMENTS

EP 0283219 9/1988
(Continued)

OTHER PUBLICATIONS

Five (5) sheets of website information from Panasonic website—downloaded Mar. 2, 1999.
(Continued)

*Primary Examiner* — Ha Tran T Nguyen
*Assistant Examiner* — Arleen M Vazquez
(74) *Attorney, Agent, or Firm* — Wilson Sonsini Goodrich & Rosati

(57) ABSTRACT

A burn-in and electrical test system (20) includes a temperature controlled zone (22) and a cool zone (24) separated by a transition zone 25. The temperature controlled zone (22) is configured to receive a plurality of wafer cartridges (26) and connect the cartridges (26) to test electronics (28) and power electronics (30), which are mounted in the cool zone (24). Each of the wafer cartridges (26) contains a semiconductor wafer incorporating a plurality of integrated circuits. The test electronics (28) consists of a pattern generator PCB (100) and a signal driver and fault analysis PCB (102) connected together by a parallel bus (104). The pattern generator PCB (100) and the fault analysis PCB (102) are connected to a rigid signal probe PCB (104) in cartridge (26) to provide a straight through signal path. The probe PCB (104) is rigid in order to allow close control of capacitance between each signal line and a backplane, thus providing impedance controlled interconnections between a semiconductor wafer under test and the test electronics (28). The power distribution system (30) is connected to a probe power PCB (106) in the cartridge (26). The probe power PCB (106) has at least a bendable portion in order to allow it to be positioned closely adjacent to and parallel with the rigid probe PCB (104), yet extend a substantial distance away from the probe PCB (106) at its interconnection (109).

5 Claims, 16 Drawing Sheets

U.S. PATENT DOCUMENTS

| | | | |
|---|---|---|---|
| 4,258,620 A | 3/1981 | Sallander | |
| 4,374,317 A | 2/1983 | Bradshaw | |
| 4,577,847 A | 3/1986 | Schedwin | |
| 4,662,043 A | 5/1987 | Stone et al. | |
| 4,818,933 A | 4/1989 | Kerschner et al. | |
| 5,103,168 A | 4/1992 | Fuoco | |
| 5,174,772 A | 12/1992 | Vranish | |
| 5,385,487 A | 1/1995 | Beitman | |
| 5,389,556 A * | 2/1995 | Rostoker et al. | 438/17 |
| 5,399,505 A * | 3/1995 | Dasse et al. | 438/17 |
| 5,429,510 A | 7/1995 | Barraclough et al. | |
| 5,510,724 A | 4/1996 | Itoyama et al. | |
| 5,568,054 A * | 10/1996 | Iino et al. | 324/760 |
| 5,570,032 A | 10/1996 | Atkins et al. | |
| 5,593,903 A | 1/1997 | Beckenbaugh et al. | |
| 5,597,737 A | 1/1997 | Greer et al. | |
| 5,600,257 A | 2/1997 | Leas et al. | |
| 5,614,837 A | 3/1997 | Itoyama et al. | |
| 5,621,313 A | 4/1997 | Tsuta | |
| 5,654,588 A | 8/1997 | Dasse et al. | |
| 5,656,943 A | 8/1997 | Montoya et al. | |
| 5,682,472 A | 10/1997 | Brehm et al. | |
| 5,701,666 A | 12/1997 | DeHaven et al. | |
| 5,743,324 A | 4/1998 | Kunstreich et al. | |
| 5,777,485 A | 7/1998 | Tanaka et al. | |
| 5,808,474 A | 9/1998 | Hively et al. | |
| 5,834,946 A * | 11/1998 | Albrow et al. | 324/750.09 |
| 5,859,539 A | 1/1999 | Wood et al. | |
| 5,894,218 A | 4/1999 | Farnworth et al. | |
| 5,905,382 A | 5/1999 | Wood et al. | |
| 5,945,834 A | 8/1999 | Nakata et al. | |
| 6,046,600 A * | 4/2000 | Whetsel | 324/763 |
| 6,066,181 A | 5/2000 | DeMaster | |
| 6,084,215 A | 7/2000 | Furuya et al. | |
| 6,133,054 A | 10/2000 | Henson | |
| 6,140,616 A | 10/2000 | Andberg | |
| 6,144,210 A * | 11/2000 | Brooks | 324/519 |
| 6,147,506 A | 11/2000 | Ahmad et al. | |
| 6,147,605 A | 11/2000 | Vega et al. | |
| 6,205,652 B1 | 3/2001 | Yonezawa et al. | |
| 6,340,895 B1 | 1/2002 | Uher et al. | |
| 6,377,471 B1 * | 4/2002 | Chong et al. | 361/796 |
| 6,410,936 B1 * | 6/2002 | Hongo | 257/48 |
| 6,411,116 B1 | 6/2002 | DeHaven et al. | |
| 6,413,113 B2 | 7/2002 | Uher et al. | |
| 6,420,766 B1 | 7/2002 | Brown et al. | |
| 6,426,638 B1 | 7/2002 | Di Stefano | |
| 6,426,904 B2 | 7/2002 | Barth et al. | |
| 6,433,419 B2 | 8/2002 | Khandros et al. | |
| 6,562,636 B1 | 5/2003 | Richmond, II et al. | |
| 6,640,323 B2 * | 10/2003 | Akram | 714/724 |
| 6,682,945 B2 | 1/2004 | Richmond, II et al. | |
| 7,063,544 B2 * | 6/2006 | Gunn et al. | 439/78 |
| 7,208,968 B2 * | 4/2007 | Weber et al. | 324/750.05 |
| 7,619,482 B1 * | 11/2009 | Kobayashi | 330/311 |
| 2002/0002008 A1 | 1/2002 | Uher et al. | |
| 2004/0113645 A1 | 6/2004 | Richmond, II et al. | |

FOREIGN PATENT DOCUMENTS

| | | |
|---|---|---|
| EP | 0579993 | 1/1994 |
| JP | 08 005666 | 1/1996 |
| JP | 08204137 | 8/1996 |
| JP | 08222693 | 8/1996 |
| JP | 09017832 | 1/1997 |
| JP | 10 189670 | 7/1998 |
| JP | 10189672 | 7/1998 |
| JP | 10189673 | 7/1998 |
| JP | 10199943 | 7/1998 |
| JP | 10199944 | 7/1998 |

OTHER PUBLICATIONS

C. Buck, "The Economic Benefits of Test During Burn-In: Real-World Experiences," IEEE International Test Conference, Washington, D.C., Sep. 1987.

1998 Annual Report of AEHR Test Systems.

* cited by examiner

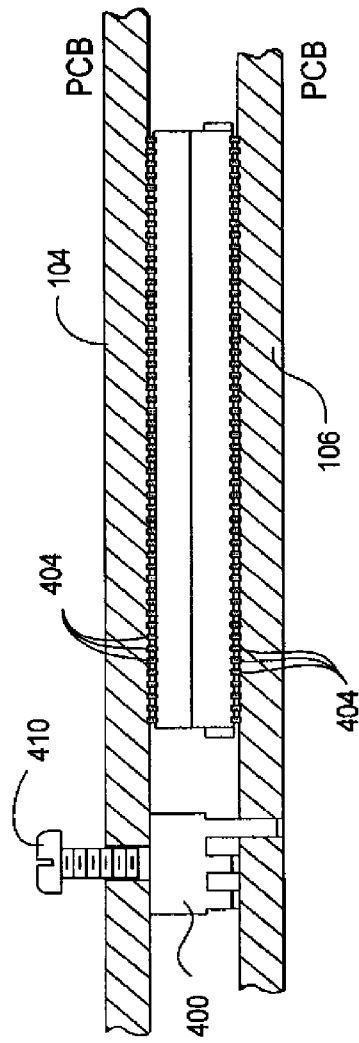
FIG. 15
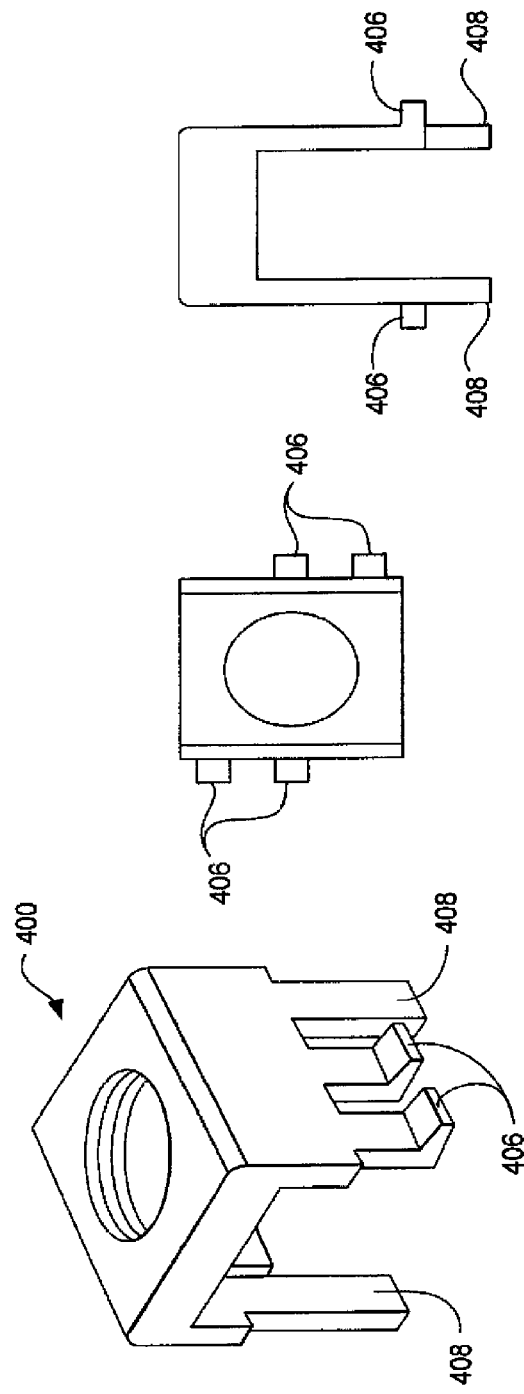
FIG. 16A
FIG. 16B
FIG. 16C

WAFER LEVEL BURN-IN AND ELECTRICAL TEST SYSTEM AND METHOD

RELATIONSHIP TO CO-PENDING APPLICATIONS

This application is a continuation of U.S. application Ser. No. 10/718,825, filed Nov. 21, 2003, now U.S. Pat. No. 7,619, 428, which is a continuation of U.S. application Ser. No. 09/865,957, filed May 25, 2001, now U.S. Pat. No. 6,682,945, which is a divisional of U.S. application Ser. No. 09/353,121 filed Jul. 14, 1999, now issued as U.S. Pat. No. 6,562,636. U.S. application Ser. Nos. 10/718,825, 09/865,957 and 09/353,121 are incorporated herein by reference in their entirety.

ORIGIN OF THE INVENTION

This invention was supported in part by grants from DARPA. The U.S. Government may have rights in this invention.

BACKGROUND OF THE INVENTION

1. Field of the Invention

The present invention relates generally to a system and method for evaluation of integrated circuits and other semiconductor devices. More particularly, it relates a system incorporating hardware and suitable interconnections which allow efficient burn-in testing of a multiplicity of semiconductor devices while still incorporated in a semiconductor wafer. This invention is related to the inventions in commonly owned U.S. Pat. No. 5,429,510, issued to Barraclough et al. on Jul. 5, 1995, entitled "High-Density Interconnect Technique," and commonly owned U.S. Pat. No. 5,682,472, issued to Brehm et al. on Oct. 28, 1997 and entitled "Method and System for Testing Memory Programming Devices," the disclosures of which are hereby incorporated by reference herein. This invention is further related to the invention in a concurrently filed, copending, commonly owned application filed in the names of Frank O. Uher, Mark C. Carbone, John W. Andberg and Donald P. Richmond II, entitled "Wafer Level Burn-In and Test Cartridge" Ser. No. 09/353/214 the disclosure of which is also incorporated by reference herein.

2. Description of the Prior Art

When fabrication of integrated circuits and other semiconductor devices has been completed, the semiconductor devices are subjected to burn-in and electrical tests in order to identify and eliminate defective semiconductor devices before shipment to a customer. The term "burn-in" relates to operation of an integrated circuit at a predetermined temperature or temperature profile, typically an elevated temperature in an oven, a reduced temperature in an environmentally controlled enclosure, or a combination of an elevated temperature followed by a reduced temperature. Certain operating electrical bias levels and/or signals are supplied to the semiconductor devices while they are at the elevated temperature. The use of the elevated temperature or the combination of an elevated temperature followed by a reduced temperature accelerates stress to which the devices are subjected during burn-in, so that marginal devices that would otherwise fail shortly after being placed in service fail during burn-in and are eliminated before shipping. In electrical test, a more complete set of operating electrical bias levels and signals are supplied to the device to provide a thorough evaluation of its functions.

As is apparent from the Brehm et al. patent, there are a variety of burn in and electrical test systems known in the art for burn-in and electrical test of integrated circuits and other semiconductor devices. To date, most of the prior art systems carry out the burn-in and electrical test after the integrated circuits have been separated into individual chips or die from a wafer in which they have been manufactured.

More recently, interest has developed in wafer-level burn-in systems, some of which systems also include electrical test capability. In these systems, the integrated circuits undergo burn-in and may undergo electrical test prior to separation into individual integrated circuit chips.

Wafer-level burn-in systems have attracted interest because they allow defective integrated circuits to be identified by the burn-in process before additional expense is incurred in their handling and packaging. Similarly, it is desirable to carry out electrical test of the integrated circuits while they are still in wafer form. Electrical test involves applying a suite of electrical signal inputs to each integrated circuit to make sure that it performs properly for its intended use.

While the ability to carry out both burn-in and electrical test in a single wafer-level system is a highly desired result, there are significant interconnection, signal supply and power supply problems to be overcome before such a system can be implemented in practice. In a preferred implementation, the present invention is directed to solving those problems. In its broadest form, aspects of the present invention may, however, be employed in a system that carries out wafer-level burn-in or wafer-level electrical test alone.

SUMMARY OF THE INVENTION

In accordance with one aspect of the invention, a burn-in test system includes a device under test zone configured to receive a plurality of cartridges each containing a semiconductor wafer including a plurality of integrated circuits. Each of the plurality of cartridges includes a rigid probe signal printed circuit board and a probe power printed circuit board substantially parallel to and closely spaced from the rigid probe printed circuit board. Test electronics are positioned adjacent to the device under test zone. Power electronics are positioned adjacent to said device under test zone. A first interconnection system connects the test electronics to the rigid probe signal printed circuit board. A second interconnection system connects the power electronics to the probe power printed circuit board. The first and second interconnection systems are arranged in a stacked relationship. The probe power printed circuit board has at least a bendable section permitting a portion of the probe power printed circuit board to be spaced a greater distance away from the rigid probe signal printed circuit board proximate to the second interconnection system.

In accordance with a second aspect of the invention, a test system includes a device under test zone configured to receive a plurality of cartridges each containing a semiconductor wafer including a plurality of integrated circuits. Each of the plurality of cartridges includes a rigid probe signal printed circuit board and a probe power printed circuit board substantially parallel to and closely spaced from the rigid probe printed circuit board. Test electronics are positioned adjacent to said device under test zone. Power electronics are positioned adjacent to the device under test zone. A first interconnection system connects the test electronics to the rigid probe signal printed circuit board. A second interconnection system connects the power electronics to the probe power printed circuit board. The first and second interconnection systems are arranged in a stacked relationship. The probe power printed circuit board has at least a bendable section permitting a portion of the probe power printed circuit board to be spaced a greater distance away from the rigid probe signal printed circuit board proximate to the second interconnection system.

In a third aspect of the invention, a burn-in system has a temperature controlled zone configured to receive a plurality of cartridges each containing a semiconductor wafer including a plurality of integrated circuits. Test electronics are positioned in a cool zone. Power electronics are positioned in the cool zone. A transition zone separates the temperature controlled zone and the cool zone.

In a fourth aspect of the invention, a test system includes a device under test zone configured to receive a plurality of cartridges each containing a semiconductor wafer including a plurality of integrated circuits. Test electronics on a first circuit board are positioned adjacent to the device under test zone. Power electronics on a second circuit board are positioned adjacent to said device under test zone. Each of the plurality of cartridges are connected to the test electronics by a first connection between one of the plurality of cartridges and the first circuit board and to the power electronics by a second connection between the one of said plurality of cartridges and the second circuit board separate from the first connection.

In a fifth aspect of the invention, a test system includes a first plurality of test channels each adapted to receive a second plurality of integrated circuits under test. A second plurality of power modules are each connected to one of the integrated circuits under test in each test channel. A controller is connected and configured for successive selection of one of the first plurality of test channels.

In a sixth aspect of the invention, a method for burn-in testing integrated circuits in wafer form includes providing a temperature controlled zone configured to receive a plurality of cartridges each containing a semiconductor wafer including a plurality of integrated circuits. The integrated circuits are tested with test electronics positioned in a cool zone. Power is provided to the integrated circuits with power electronics positioned in the cool zone. The test and power electronics are separated from the temperature controlled zone with a transition zone between the temperature controlled zone and the cool zone.

In a seventh aspect of the invention, a method for testing integrated circuits in wafer form includes connecting a first plurality of integrated circuits in a second plurality of test channels. A first plurality of power modules is connected to one of the integrated circuits under test in each test channel. One of the second plurality of test channels is selectively selected. The first plurality of the integrated circuits in the selected test channel is tested. The selective selection and testing steps are repeated until all of the integrated circuits have been tested.

In reviewing the following more detailed description and drawings of the present invention, the advantages and features of the invention should be more readily apparent to those skilled in the art.

BRIEF DESCRIPTION OF THE DRAWINGS

FIG. 15 is a cross section view of one of the interconnections in the system portion shown in FIGS. 2-4.

FIGS. 16A, 16B and 16C are perspective, top and side views of a part of the interconnection shown in FIG. 15.

DETAILED DESCRIPTION OF THE INVENTION

Figure 1:
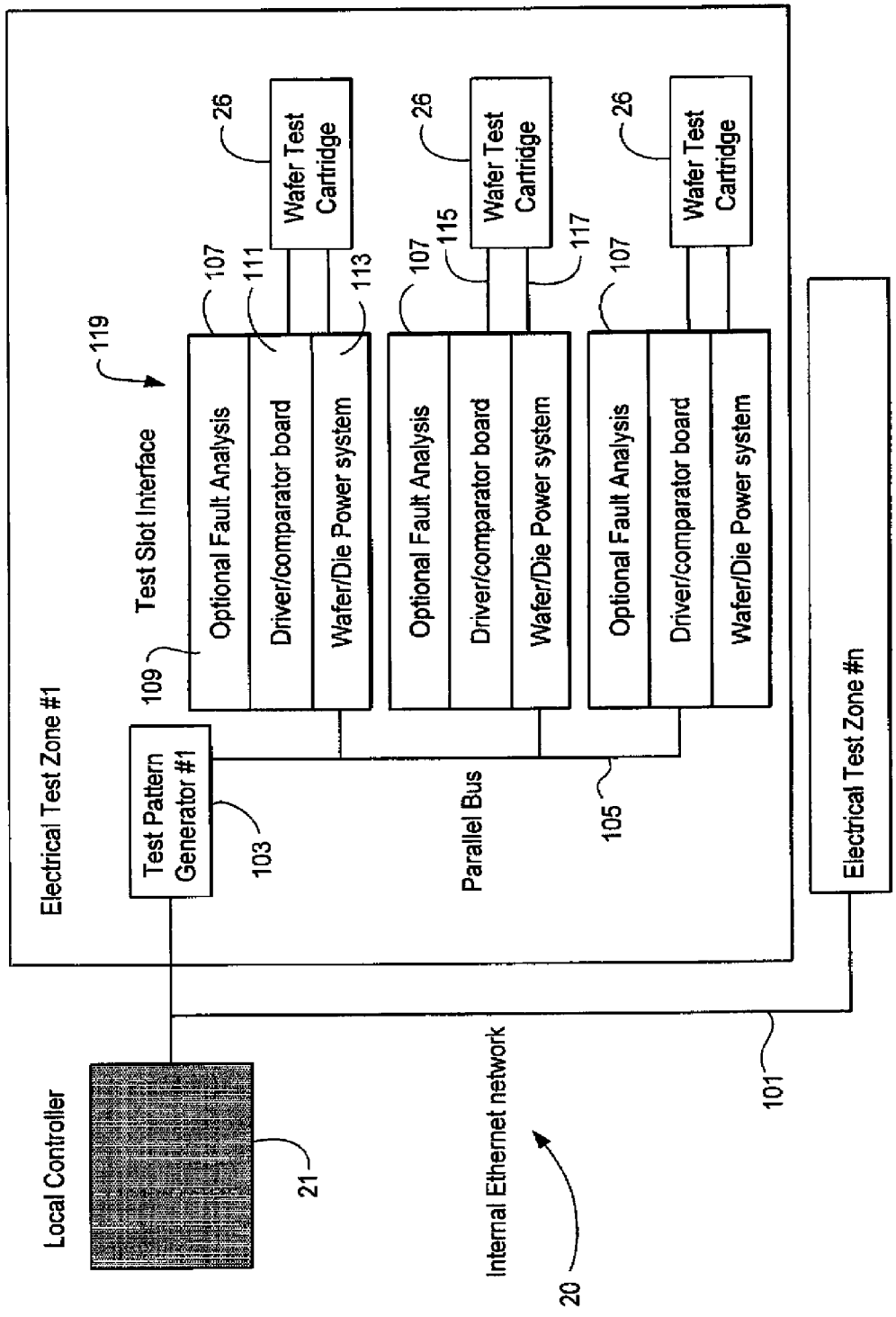
FIG. 1 is a block diagram and schematic representation of an embodiment of a burn-in and electrical test system in accordance with the invention.

Turning now to FIG. 1, there is shown a burn-in and electrical test system 20 in accordance with the invention. As shown, a local controller 21 is connected to a plurality of electrical test zones #1 through #n via an internal Ethernet network 101. Electrical test zone #1 shows the details of each electrical test zone. Each of the electrical test zones has a single test pattern generator 103 connected by a parallel bus 105 to a plurality of test slots 107 comprising a test slot interface 119. Each test slot 107 comprises optional fault analysis 109, a driver comparator board 111 and a wafer/die power system 113. Two separate connections for each wafer test cartridge 26 for test electronics and for power distribution are represented at 115 and 117. The optional fault analysis 109 and driver comparator board 111 comprise the test electronics and are connected to the wafer test cartridge 26 by connection 115. The wafer/die power system 113 is connected to the wafer test cartridge 26 by connection 117.

Figure 2:
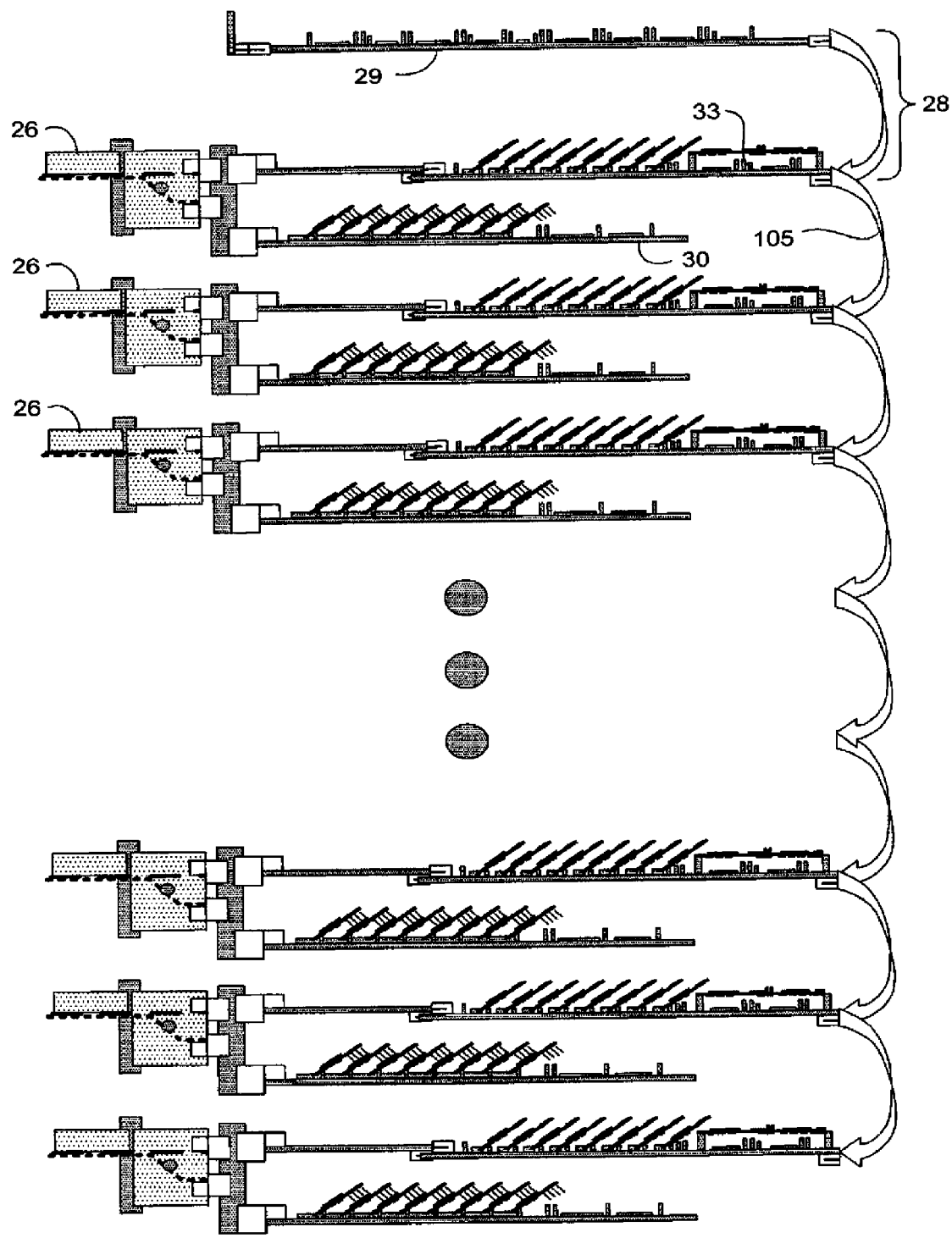
FIG. 2 is a block diagram and schematic representation of part of the system shown in FIG. 1.

FIG. 2 shows a portion of the system 20 of FIG. 1. A plurality of wafer cartridges 26 are connected to test electronics 28 and power electronics 30. The test electronics 28 comprises a single pattern generator printed circuit board (PCB) 29 and separate signal driver and fault analysis PCBs 33 for each wafer cartridge 26. Each of the wafer cartridges 26 contains a semiconductor wafer incorporating a plurality of integrated circuits. All of the signal driver and fault analysis PCBs 33 are connected to the pattern generator PCB by parallel bus 105. Further details of the cartridges 26 are contained in a concurrently filed, co-owned pending application entitled "Wafer Level Burn-In and Test Cartridge and Alignment Method," filed in the names of Frank O. Uher, Mark C. Carbone, John W. Andberg and Donald P. Richmond II Ser. No. 11/276,314, the disclosure of which is hereby incorporated by reference herein. Some aspects of the cartridge 26 will be described below as necessary for a more complete understanding of the present invention.

Figure 3:
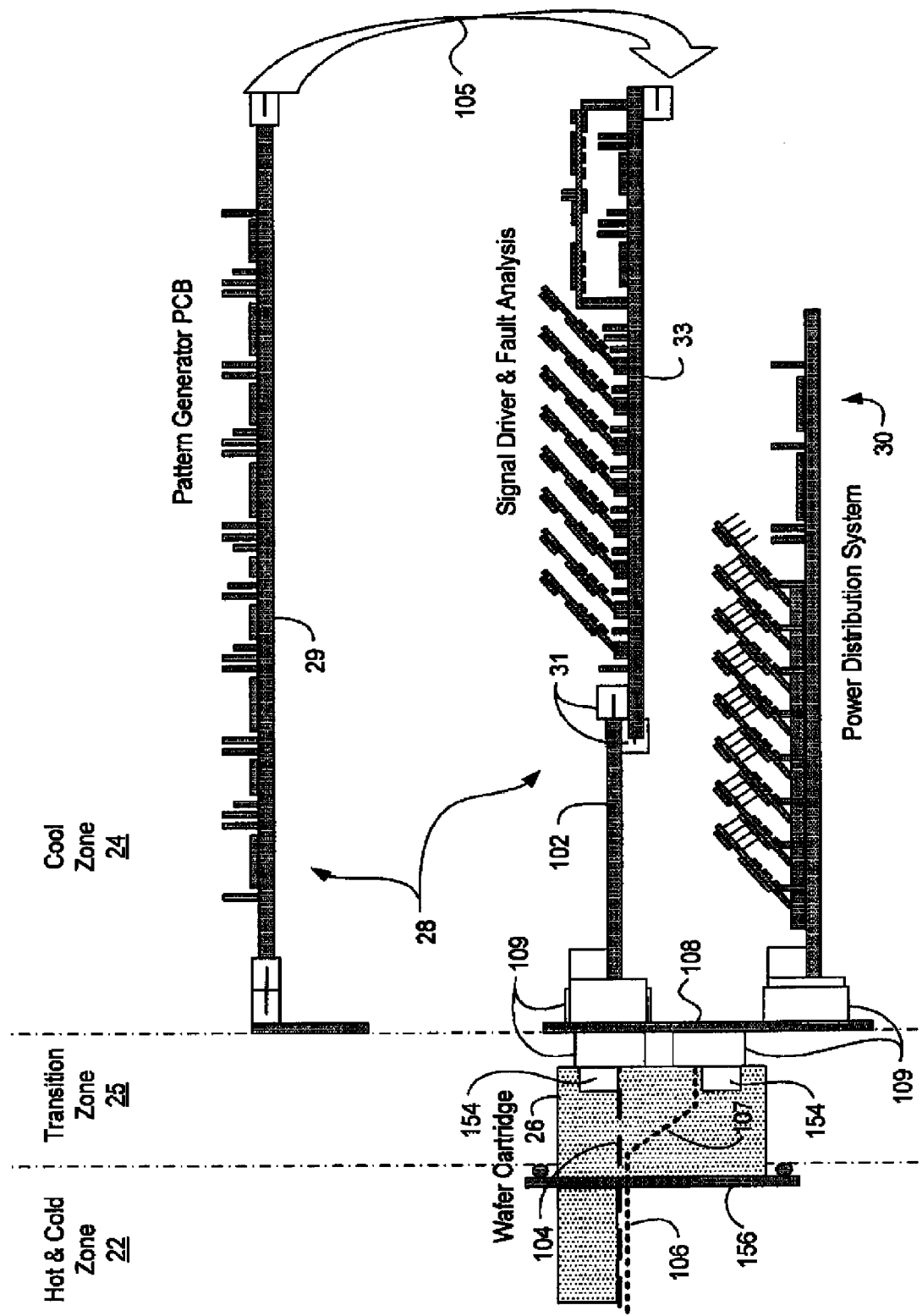
FIG. 3 is another more detailed block diagram and schematic representation of the part of the system shown in FIG. 2.
Figure 4:
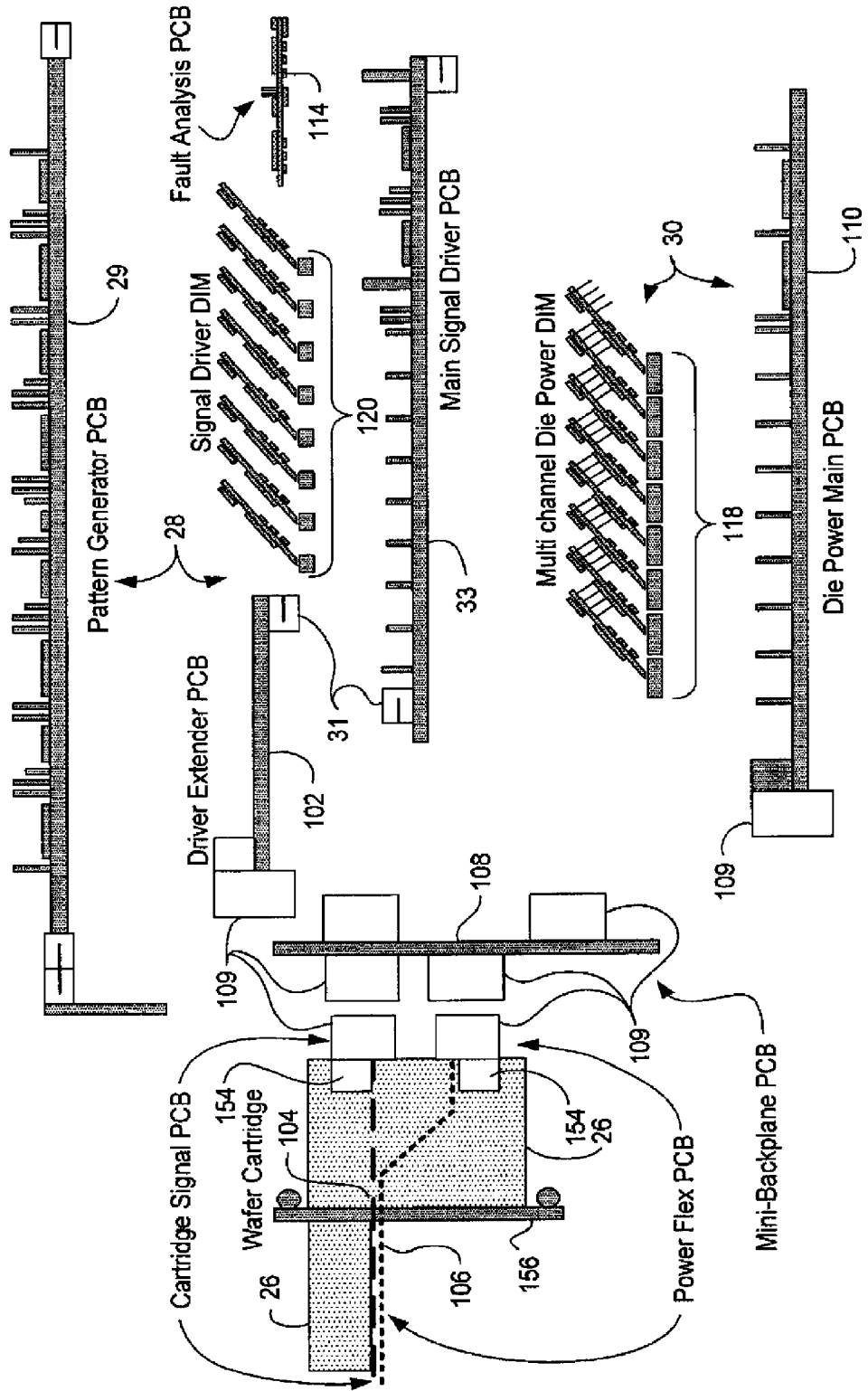
FIG. 4 is a partially exploded block diagram of the part of the system shown in FIG. 3.

FIGS. 3 and 4 show further details of the wafer cartridge 26, test electronics 28 and power electronics 30 and how they are interconnected. As shown in FIG. 3, the test electronics 28 consists of a pattern generator PCB 29 and a signal driver and fault analysis PCB 33 connected together by the parallel bus 105. The fault analysis PCB 33 is connected to a rigid signal probe PCB 104 in cartridge 26 through a driver extender PCB 102 to provide a straight through signal path. The probe PCB 104 is rigid in order to allow close control of impedance between each signal line and a backplane, to be discussed more fully below in connection with FIGS. 10, 12 and 13, thus providing impedance controlled interconnections between a semiconductor wafer under test and the test electronics 28.

The portion of the system 20 shown in FIGS. 3 and 4 is divided into a temperature controlled zone 22, a cool or ambient temperature zone 24 and a transition zone 25. The temperature controlled zone is either heated to an elevated temperature, such as 150° C., or chilled, such as to a temperature of 0° C. during the burn-in or test operation. The wafer cartridge 26 extends from the temperature controlled zone 22 into the transition zone 25. A thermal dam 156 is positioned around the wafer cartridge 26 at the interface between the temperature controlled zone and the transition zone to minimize heat transfer between the zones around the cartridge 26. The transition zone 25 is provided in order to prevent heat or cold leakage from the controlled temperature zone into the signal driver and fault analysis PCB 33. Such heat or cold leakage would change the temperature of the PCB 33 over time, thus causing a performance change, resulting in a variation of test conditions over time. Additionally, cold leakage into the PCB 33 would result in condensation or thermal damage to the PCB 33.

The driver extender PCB 102 serves to space the signal driver and fault analysis PCB 33 from the temperature controlled zone 22 and the transition zone 25 for further heat and cold isolation. Additionally, the driver extender PCB 102 permits impedance matching of the signal probe PCB and the signal driver and fault analysis PCB 33. In practice, the signal probe PCB 104 has an impedance of about 50 ohm, and the signal driver and fault analysis PCB 33 has an impedance of about 28 ohm. The driver extender PCB has a varying impedance along its length, from about 28 ohm on the signal driver and fault analysis PCB 33 end to about 50 ohm on the signal probe PCB 104 end. This impedance matching permits higher quality signals to be transmitted between the signal driver and fault analysis PCB 33 and the signal probe PCB 104.

The power distribution system 30 is connected to a probe power PCB 106 in the cartridge 26. The probe PCB 106 has a flexible portion 107 order to allow it to be positioned closely adjacent to and parallel with the rigid probe PCB 104 along most of its extent in the cartridge 26, yet extend a substantial distance away from the probe PCB 106 at its interconnection with the power distribution system 30.

The cartridge 26 is connected to the test electronics 28 and the power distribution system 30 through a mini-backplane PCB 108. High pin density connectors 109 are used to connect the cartridge 26 to the driver extender PCB 102 and to the power distribution system 30. The connectors 109 include a total of 4200 pin connections, compared with a total of 680 pin connections in the system described in the above-referenced Brehm et al. patent. The connectors have insulated pins and the signal pins are set in an electromagnetic interference (EMI) shield housing. Suitable high pin density connectors 109 of this type are commercially available from AMP Incorporated, Harrisburg, Pa. and will not be further described herein.

The power distribution system 30 includes a die power main PCB 110 and a set 118 of 32-channel die power dual-in-line modules (DIMs) mounted on the die power main PCB 110. In the test electronics 28, the driver extender board 102 is connected to a main signal driver PCB 33 by an interconnection system 31. A set 120 of signal driver DIMs and a fault analysis PCB 114 are mounted on the main signal driver PCB 33.

Figure 4A:
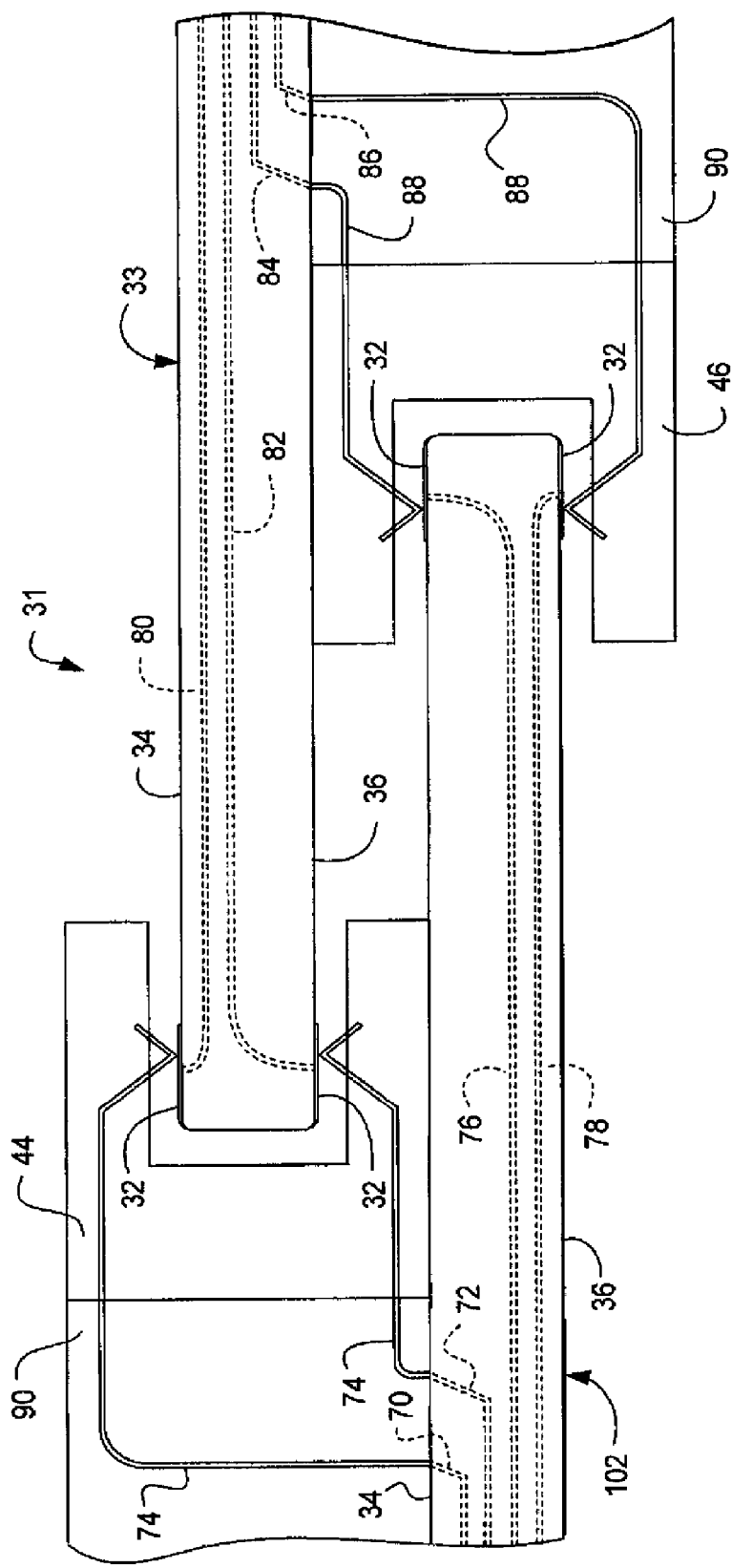
FIG. 4A is a cross section view of an interconnection system used in the part of the system portion shown in FIG. 2.

FIG. 4A shows details of the interconnection 31. This interconnection system is the subject of the above-referenced Barraclough et al. patent.

The system 31 employs contact fingers 32 on both surfaces 34 and 36 of PCB 102 and PCB 33. Each of the PCBs 102 and 33 has a card-edge connector 44 and 46. The contact fingers 32 and the card-edge connectors 44 and 46 of each PCB mate inversely with each other on adjacent PCBs, i.e., the card-edge connector 44 of the PCB 102 mates with contact fingers 32 of the PCB 33, and the card-edge connector 46 of the PCB 33 mates with the contact fingers of the PCB 102. The PCB 102 has two sets 70 and 72 of interconnections connected to metal contacts 74 of the card-edge connector 44 and two sets of 76 and 78 of interconnections connected to contact fingers 32 of the PCB 33. Similarly, PCB 33 has two sets 80 and 82 of interconnections connected to contact fingers 32 of the PCB 33 and two sets 84 and 86 of interconnections connected to metal contacts 88 of the card-edge connector 46. With this interconnection system 31 there is twice the density of interconnects per inch using the same card-edge connector compared with a typical prior art interconnection system, for example, 40 interconnects per inch of card edge between two PCBs, compared with 20 interconnects per inch in the prior art example.

Besides doubling the number of interconnects, the interconnection system 31 is self-aligning. The card-edge connectors 44 and 46 are each set back from the contact fingers of their respective PCBs 38 and 40. Using PCBs 38 and 40 of the same thickness and using connectors 44 and 46 with identical geometry that are mounted directly on the PCBs for both PCBs that are connected together, all dimensional relationships are maintained when the assembly is inverted for the second connection. Connector support bars 90 are provided, fixedly attached (such as bolted) on each PCB 38 and 40 behind the connectors 44 and 46 to provide sufficient structural rigidity and support for plugging and unplugging the connectors 44 and 46.

Figure 5:
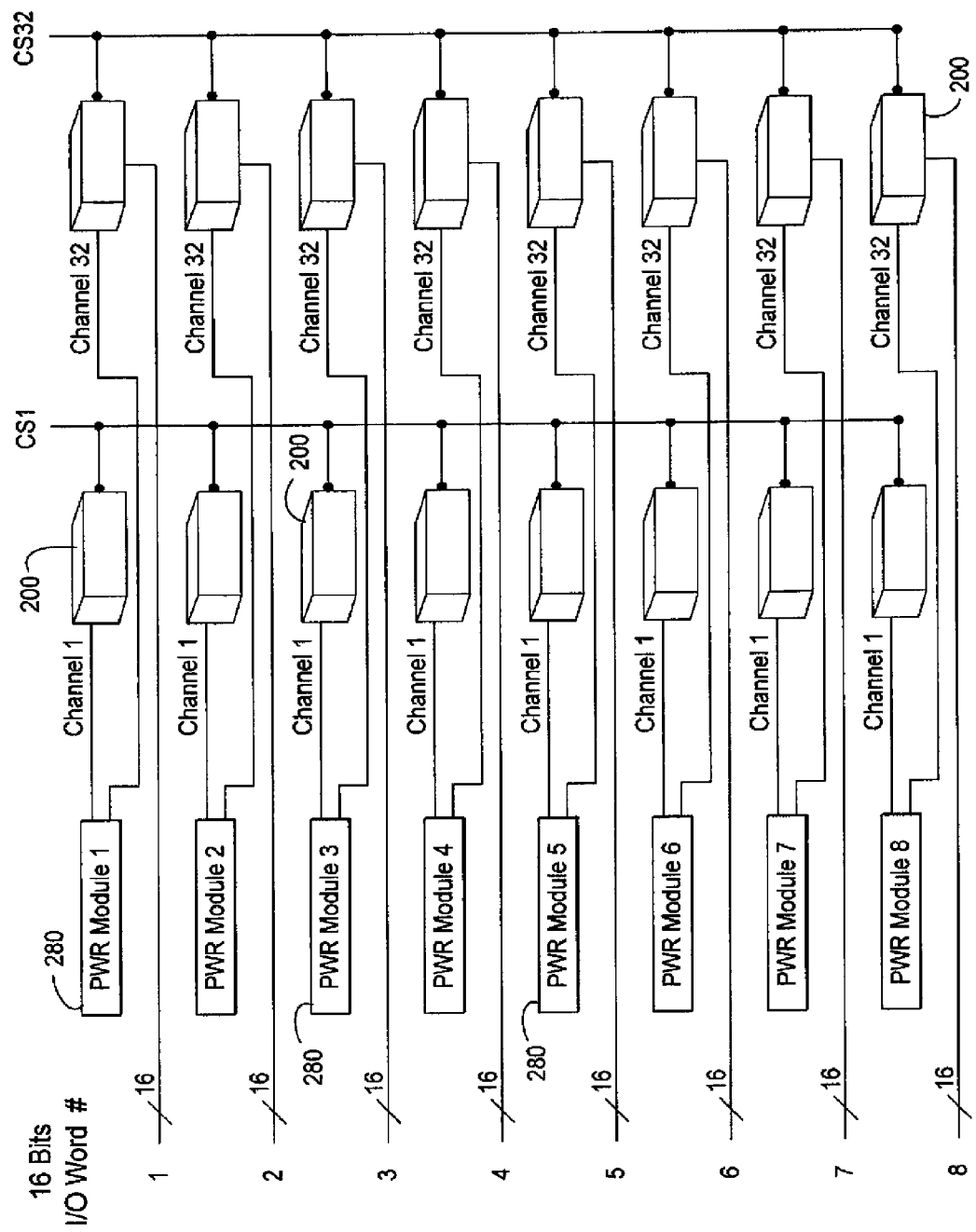
FIG. 5 is a block diagram of another part of the system shown in FIGS. 1-4.
Figure 10:
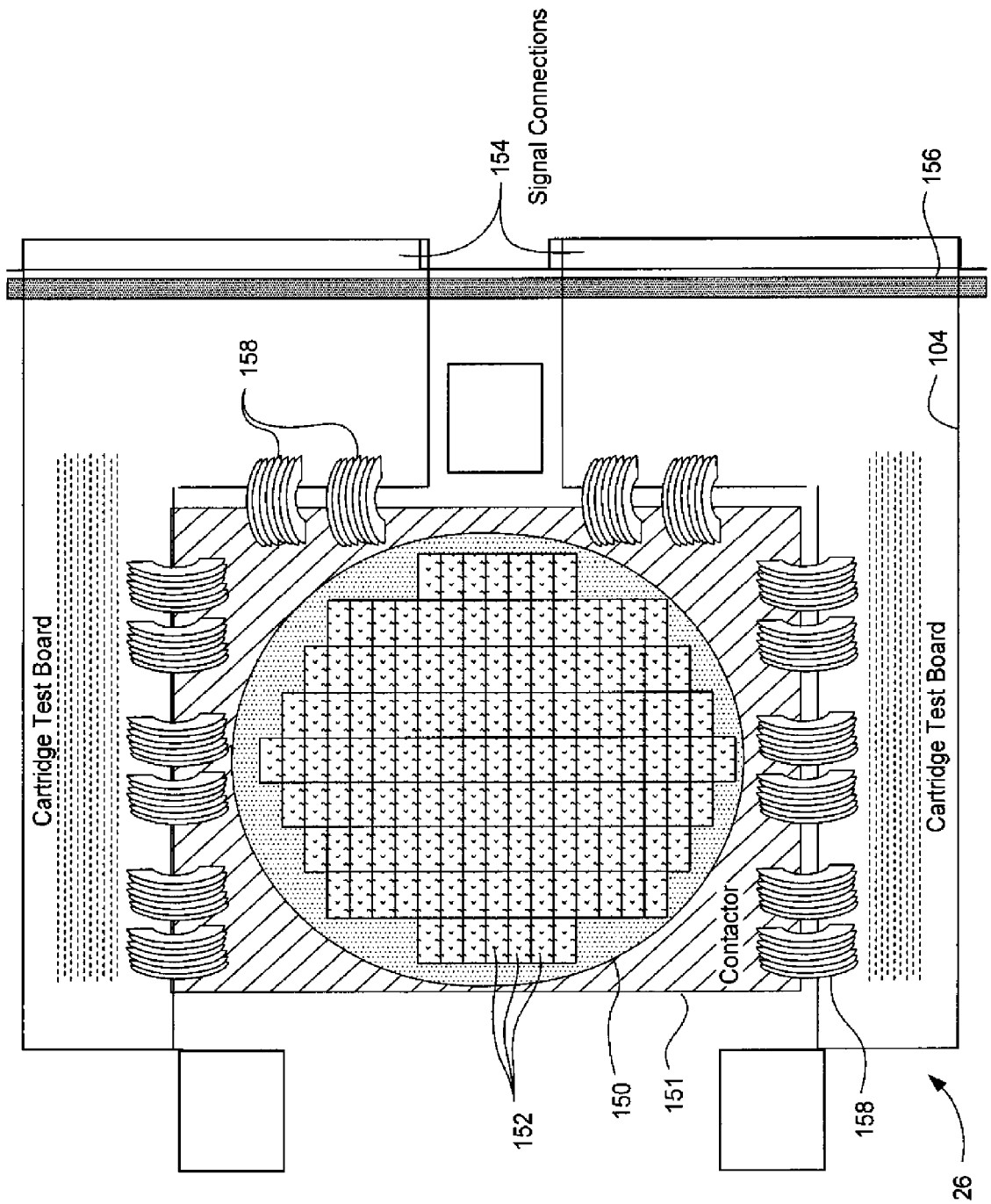
FIGS. 10 and 11 are somewhat schematic representations of interconnections used in the system portion shown in FIGS. 2-4.
Figure 11:
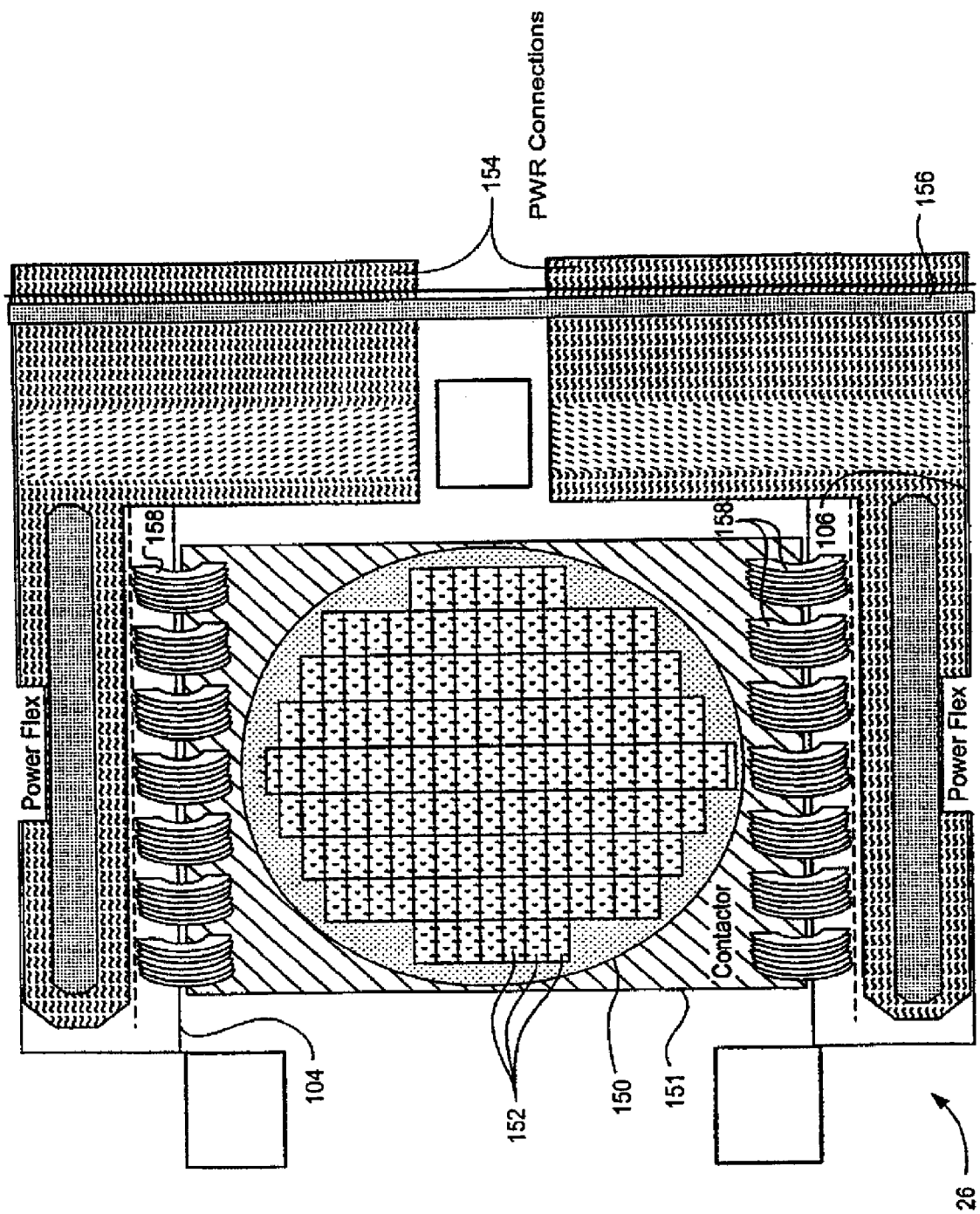

FIG. 5 shows the parallel test processing capability and segmented power distribution of the system 20. Each power module 280 is connected to 32 devices under test 200 comprising 32 channels. While carrying out the testing, only one of the 32 channels is made active at a time using the chip select lines 282. This means that only one device under test 200 is powered by each power module 280 at a time, thus resulting in far less need for capacitance per power module 280. In practice, power is supplied to all of the devices 200 under test in their inactive state, but only one device per power module is powered to its active state at a time. The active state uses power at a much higher level and makes much more electrical noise on the power lines. The capacitance in each power module is provided to satisfy current demand when cycling from low to high power demand at high frequencies. There are a total of 32 power modules, but only 8 are shown in FIG. 10. This segmented mode of power distribution is far more manageable than attempting to power all of the devices under test at once.

Figure 6:
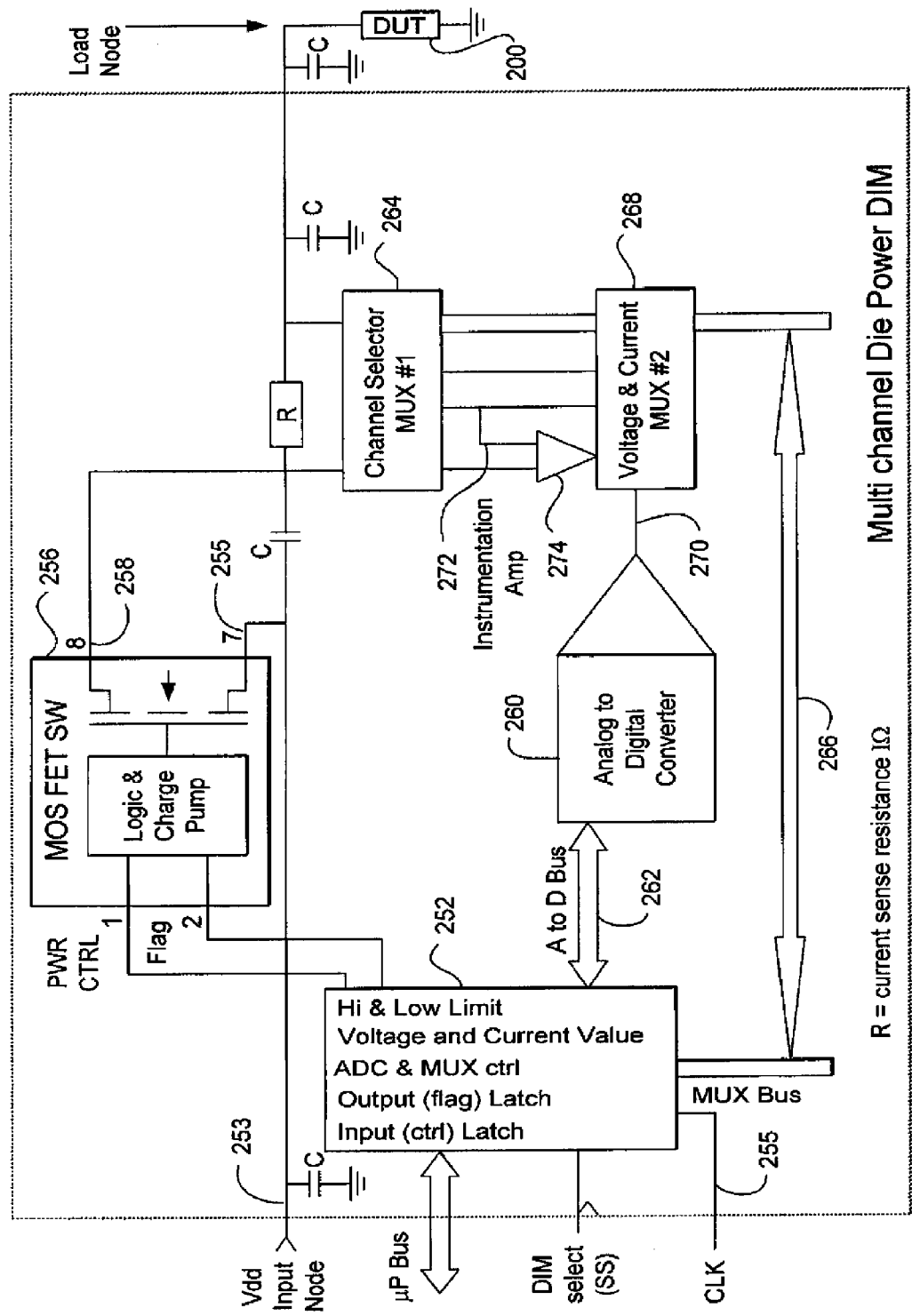
FIGS. 6 and 7 are circuit diagrams of a portion of the system part of FIG. 5.

FIG. 6 shows a circuit schematic of the power module 280. The power module 280 has a microcontrol element 252 connected at 254 to control turning on and turning off an MOS FET power switch 256. The microcontrol element 252 can be implemented as an microcontroller, a field programmable gate array (FPGA) or a Cypress programmable logic device (CPLD). A Vdd input 253 is connected to input 255 of the power switch 256. Output 258 of the power switch 256 is connected to the device under test (DUT) 200. The microcontrol element 252 is also connected to an analog to digital (A/D) converter 260 by an A/D bus 262, to a channel multiplexer 264 by a multiplexed bus 266 and to a voltage-current measurement multiplexer 268 by the multiplexed bus 266. Input 270 of the A/D converter 260 is connected to the voltage-current measurement multiplexer 268. Outputs 272 of the channel multiplexer 264 are connected through an instrumentation amplifier 274 to the voltage-current multiplexer 268. One of the outputs 272 on the DUT 200 side of R connects directly to the voltage-current multiplexer 268. The microcontrol element 252 is connected by a microprocessor bus 276 to a microprocessor on the signal driver PCB 33 (see also FIGS. 2-4). That microprocessor is an intermediate level of control between the microcontrol element 252 and another microprocessor in the local controller 21 (FIG. 1). An asynchronous clock input 255 is connected to the microcontrol element 252.

In operation, the microcontrol element 252 controls the supply of power to the devices 200 under test by sequencing the channel multiplexer 264 through channels 1-32 (see also FIG. 5). When each DUT 200 is powered, the microcontrol element controls the voltage-current multiplexer 268 to cycle between voltage and current measurements. The voltage and current inputs from the DUT 200 are supplied through the channel multiplexer to the voltage-current multiplexer 268. The A/D converter 260 converts to digital, and the microcontrol element 252 receives, the voltage and current measurements and compares those measurements against the programmed high and low limits in order to detect an under or over voltage or under or over current condition. When any is detected, the power switch 256 is turned off before damage to a probe contacting the DUT 200 can take place. The significance of local control by the microcontrol element 252 is its speed of operation. The two measurements to detect voltage and current take place within the time of about 3 milliseconds it takes power switch 256 to switch from an off to an on state. This speed of operation protects the wafer DUT 200 and the wafer probe either when failure of the DUT 200 takes place while it is under test or when the device first turns on.

Figure 7:
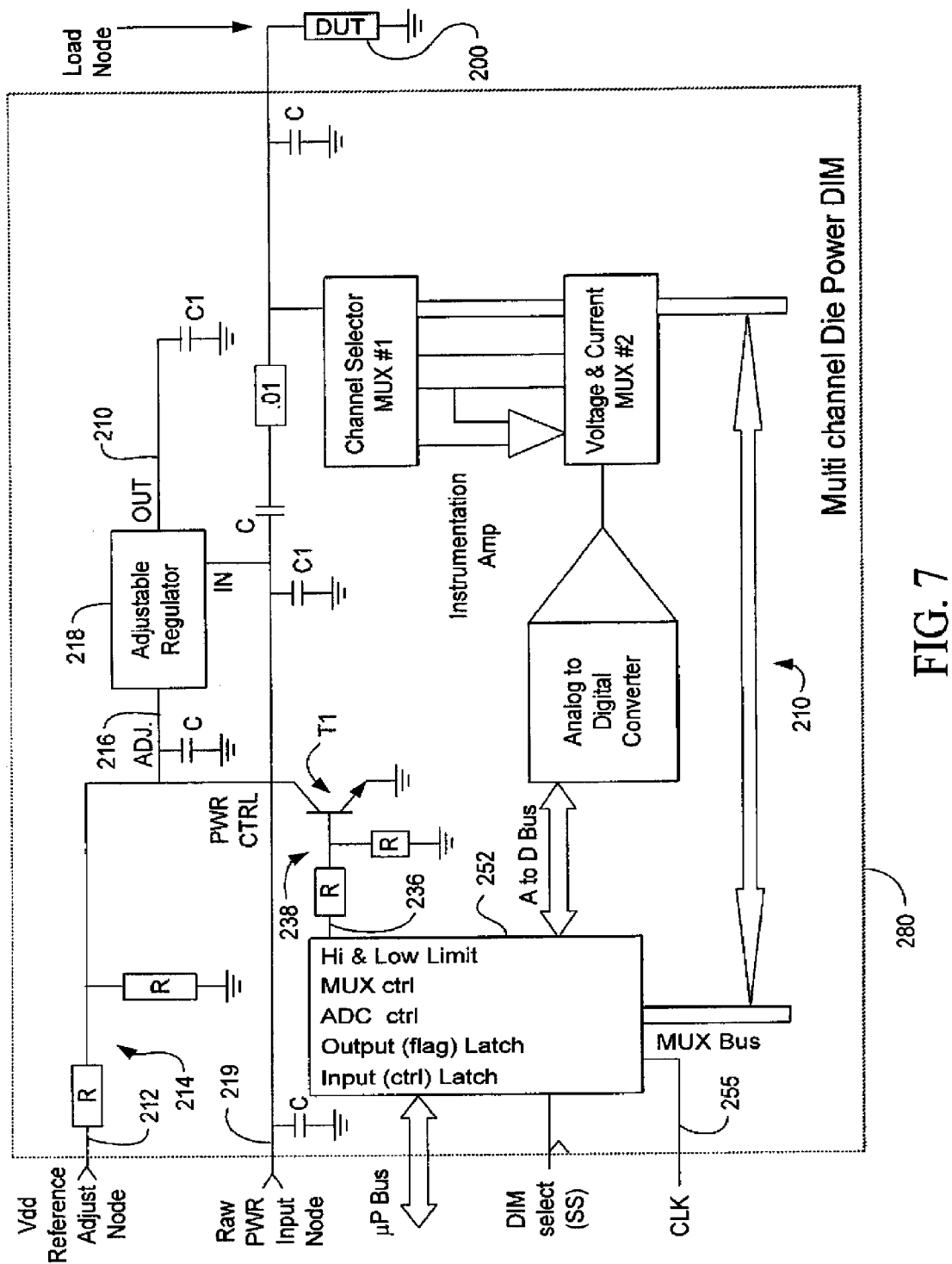

FIG. 7 shows another embodiment of a power module 280 in the form of a power regulator control and voltage/current readback circuit 210. A Vdd reference input 212 is supplied through resistor network 214 to power control transistor T1 and adjust input 216 of an adjustable regulator integrated circuit 218. A raw power input 219 is also connected to the integrated circuit 218. Output 220 of the integrated circuit 218 is connected to the device under test 200. An output 236 of the microcontrol element 252 is connected through resistor network 238 to the base of power control transistor T1. In operation, the adjustable regulator 218 attempts to adjust the raw power input at 219 to be equal to the reference at 216. When the power control transistor T1 is turned on by the microcontrol element 252, transistor T1 pulls down the adjust input 216 to the adjustable regulator integrated circuit 218, shutting it off. The circuit 210 allows custom regulation of the test voltage to each DUT 200, thus improving the accuracy of the test voltage to each device. Other than as shown and described, the construction and operation of the FIG. 7 circuit is the same as that of the FIG. 6 circuit.

Figure 8:
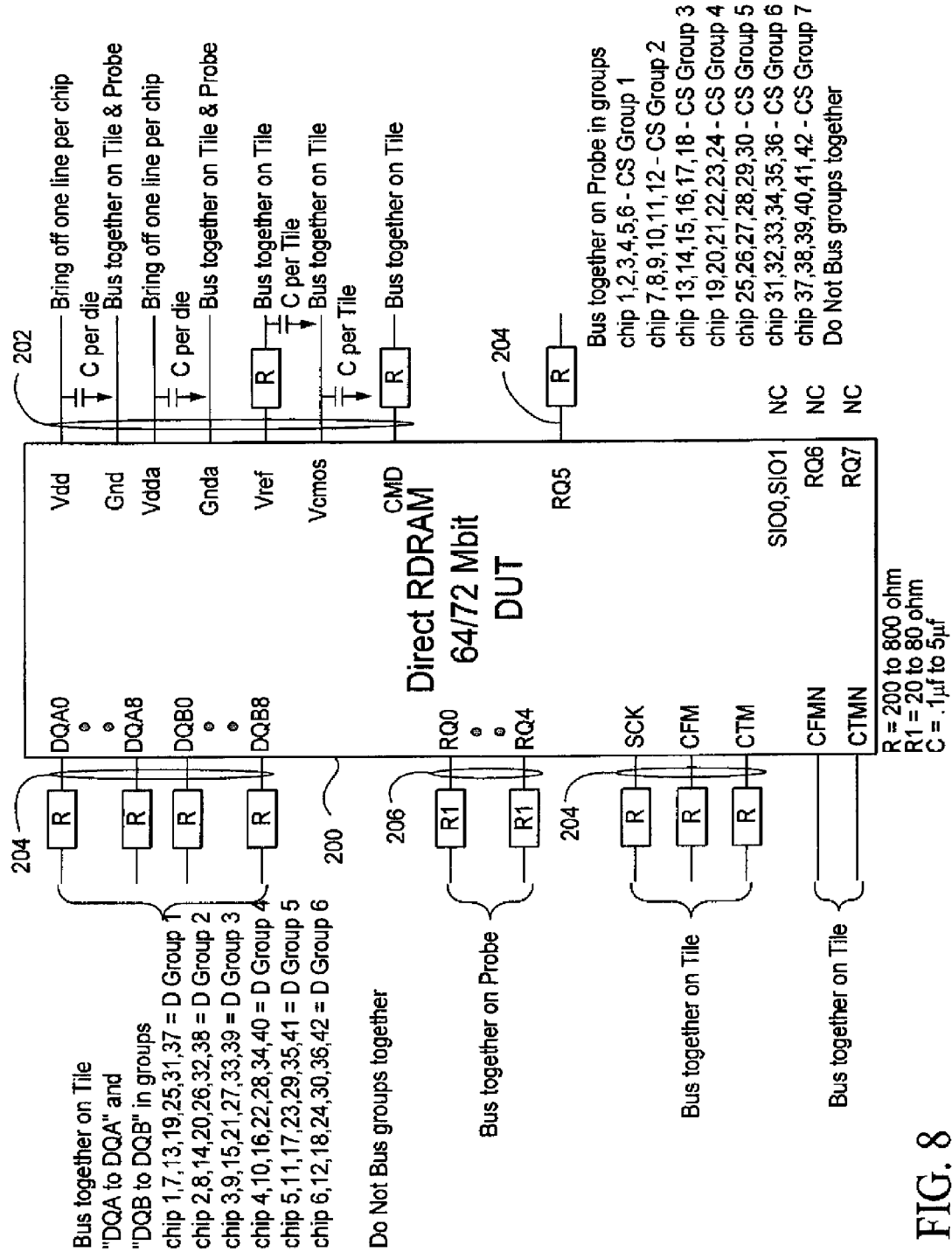
FIGS. 8 and 9 are pinout connection diagrams of integrated circuits under burn-in and test using the invention.
Figure 9:
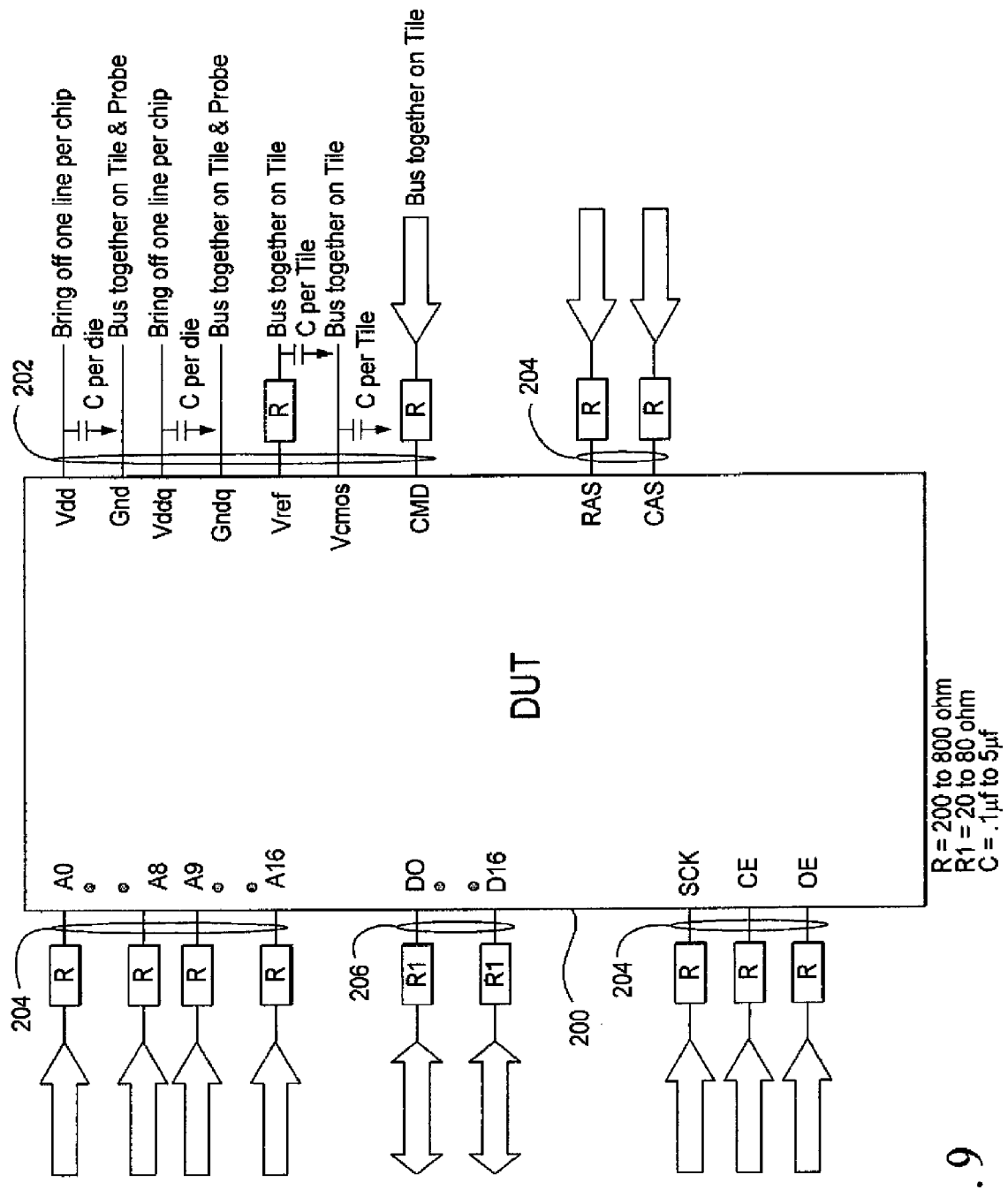

FIGS. 8 and 9 respectively show an example of signal and power connections to a Rambus dynamic random access memory (RDRAM) integrated circuit 200 and a general example of a memory integrated circuit 200 on a semiconductor wafer. As shown, connections 202 include a capacitance of 0.1 to 5μ farad for each connection. Connections 204 and two of the interconnections 202 include a resistance of 200 to 800 ohm for each connection. Connections 206 include a resistance of 20 to 80 ohm. The resistances R and R1 are provided for isolation to allow tolerating failure of any one integrated circuit 200 under test of a semiconductor wafer. The difference between R and R1 is because the integrated circuits 200 under test have a low ability to drive capacitance and the resistance R1 therefore needs to be lower to give an appropriate RC constant. In the interconnections of the cartridge 26 and the various PCBs, the connections to the integrated circuit 200 are bussed together as indicated.

Further details of the wafer cartridge 26 are shown in FIGS. 10-14. A probe 150 is centrally disposed on the probe PCB 104. The probe 150 has a plurality of tiles 152 that contain a multiplicity of contacts (not shown) for contacting each of the integrated circuits in a semiconductor wafer. The probe 150 is mounted on a contactor 151. When the wafer cartridge is loaded into the burn-in and electrical test system (see FIGS. 2-4), the portions 154 of the interconnections 109 (see also FIGS. 3 and 4) that is attached to the cartridge 26 attach to the rest of interconnections 109 on the mini-backplane PCB 108. The signal connections in the portion 154 comprise insulated pins that are set in an electromagnetic interference (EMI) shield housing. Flexible interconnections 158 electrically connect the contactor 151 to the signal probe PCB 104 and the power probe PCB 106. Since the contactor 151, the probe signal PCB 104 and the probe power PCB 106 are rigid and are made of different materials, the flexible interconnections 158 allow for differential expansion of the probe 150, probe signal PCB 104 and probe power PCB 106 when they are heated during burn-in.

Figure 12:
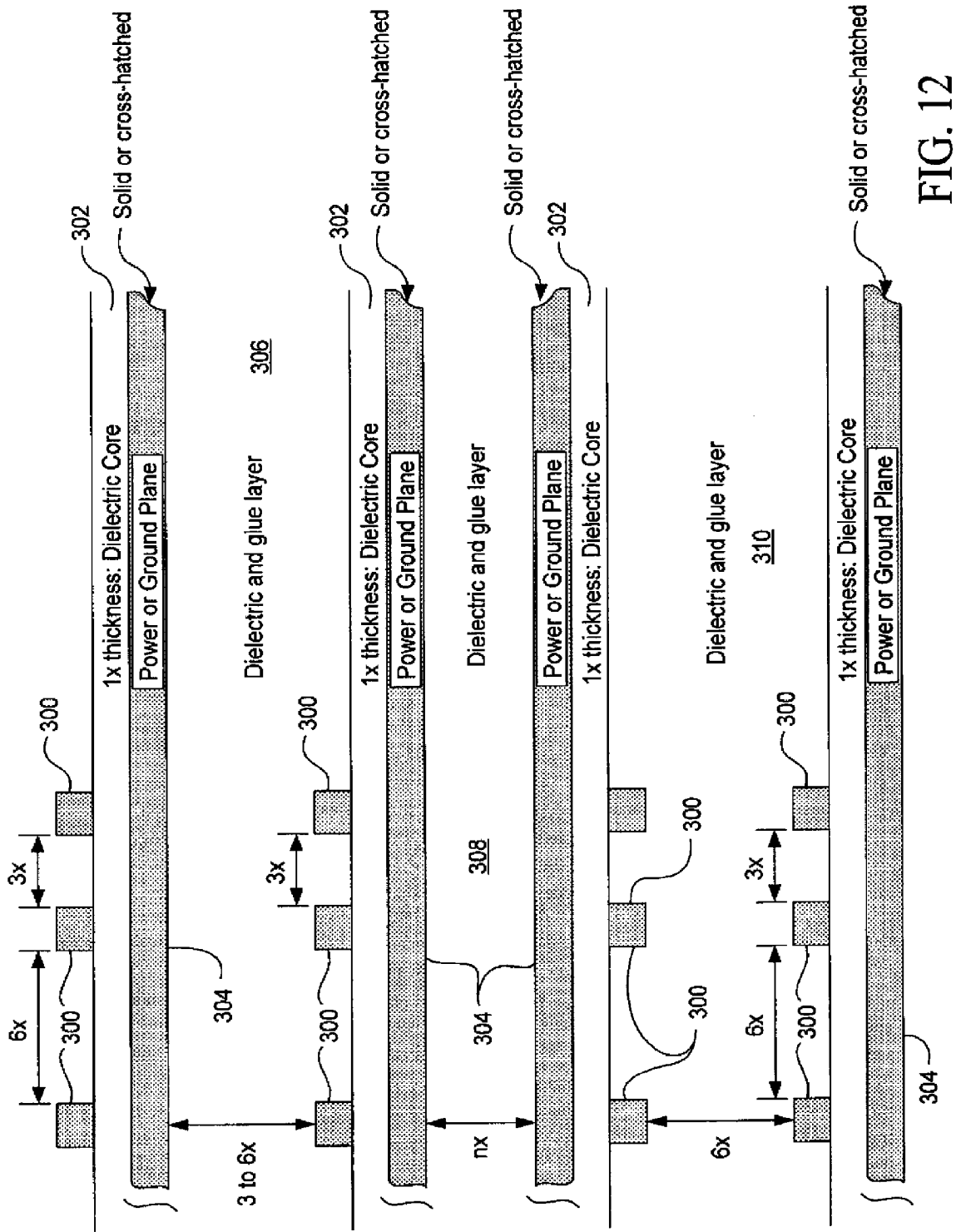
FIG. 12 is a cross section view of a portion of the interconnections shown in FIG. 10.
Figure 13:
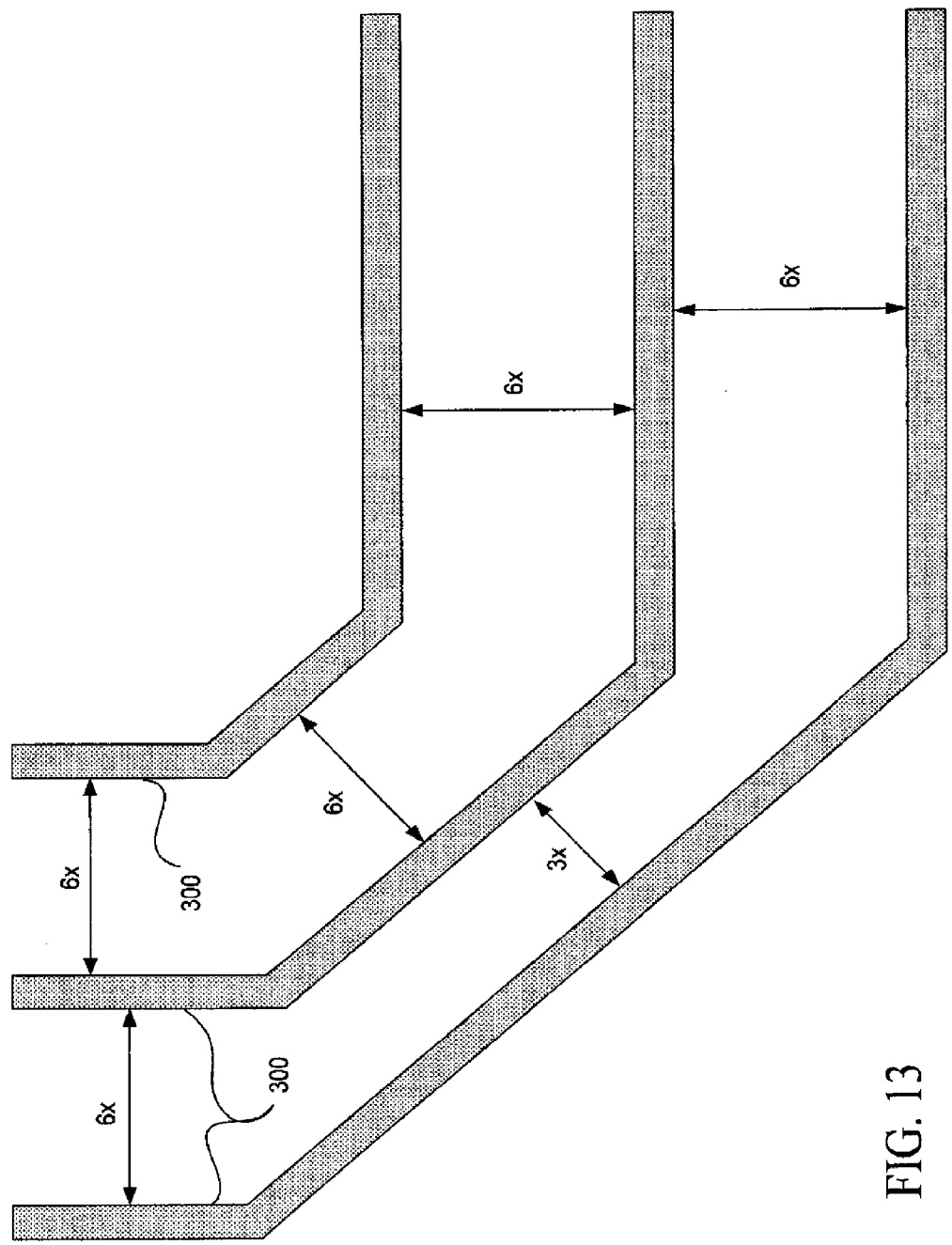
FIG. 13 is a plan view of a portion of the interconnections shown in FIG. 10.

FIGS. 12 and 13 show details of the signal probe PCB. Signal lines 300 are disposed on one side of a 1X thickness dielectric core 302, with a power or ground plane 304 on the other side of the dielectric core 302. The signal lines 300 are spaced from 3X to 6X horizontal distance apart from one another. In the layers, the signal lines are spaced a vertical distance of 3X to 6X from an adjacent power or ground plane 304 associated with another set of signal lines 300 by dielectric and glue layer 306. Adjacent power or ground planes 304 are spaced a multiple of X distance vertically from each other by dielectric and glue layer 308. Adjacent signal lines 300 associated with different power or ground planes 304 are spaced apart a distance of 6X vertically from one another by dielectric and glue layer 310. These spacing relationships minimize cross talk between adjacent conductors, and in the case of the thin separation between signal lines 300 and their associated power or ground planes 304, the dielectric core 302 is thin in order to improve AC performance.

Figure 14:
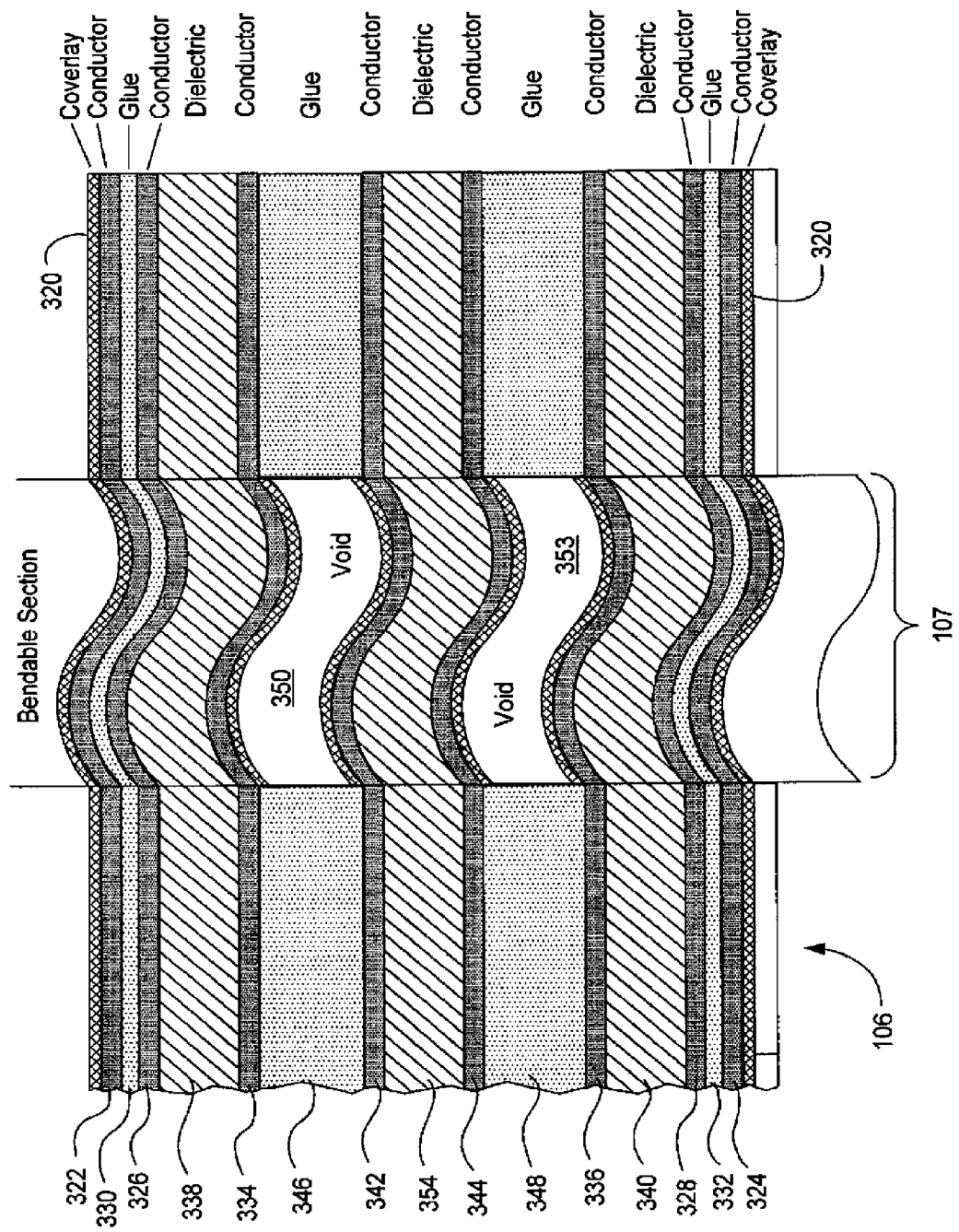
FIG. 14 is a cross section view of a portion of the interconnections shown in FIG. 11.

Details of the power probe PCB 106 are shown in FIG. 14. The power probe PCB 106 is rigid, except for the bendable section 107 that allows the power probe PCB 106 to be spaced away from the probe signal PCB 104 near the connections 109 (see also FIG. 3). The power probe PCB 106 has a coverlay 320 on its top and bottom. Moving inward from the top and bottom, conductors 322 and 324 are respectively adjacent to the coverlays 320. The conductors 322 and 324 are separated from conductors 326 and 328 by glue layers 330 and 332. Conductors 326 and 328 are separated from conductors 334 and 336 by dielectric layers 338 and 340. Conductors 334 and 336 are separated from conductors 342 and 344 by glue layers 346 and 348, except in the bendable section 107, where the conductors 334 and 336 are separated from conductors 342 and 344 by voids 350 and 352. The voids 350 and 352 permit the bendable section 107 to flex. The conductors 342 and 344 are separated from each other by dielectric layer 354.

FIGS. 15-16C show a copper ground lug 400 used for a ground connection to the PCBs 104 and 106, which are connected together by a high density board to board connector 402. Alternate pins 404 of the connector 402 are for signals and power. The presence of the ground lug 400 connected to traces on each board provides a good ground for both boards 104 and 106, so that every third pin of the board to board connector does not need to be used for ground, as in the prior art. The high density board to board connector 402 is implemented with a quad row staggered SMT socket assembly obtainable from Samtec USA, New Albany, Ind., under the designation SMT Socket Assembly. A similar SMT terminal assembly is also used to connect flexible leads 158 (FIG. 10) to the PCB 104. The ground lug has surface mount leads 406 and through hole post leads 408. The through hole post leads 408 serve to hold the two boards in registry with one another and allow screw 410 to be tightened without shearing the surface mount leads 406 from the boards 104 and 106. The ground lug 400 is also matched in height to the height of the board to board connector 402. The ground lug therefore optimizes the use of the high density connector 402 and gives a good mechanical restraining device matched in height to the mating connector set.

It should be apparent to those skilled in the art that various changes in form and details of the invention as shown and described may be made. It is intended that such changes be included within the spirit and scope of the claims appended hereto.

What is claimed is:

1. A test system for testing multiple sets of integrated circuits, the test system comprising:
    (a) a structure that temporarily and removably receives and temporarily applies test electronics to different sets of integrated circuits from among the multiple sets of integrated circuits, whereby multiple sets of integrated circuits can be tested by the same electronics of the test system;
    (b) a plurality of test channels in the test system, the plurality of test channels external to a set of integrated circuits, each test channel temporarily receiving a set of integrated circuits under test from among the multiple sets of integrated circuits;
    (c) a plurality of power modules in the test system, the plurality of power modules external to the set of integrated circuits, each power module configured to be temporarily connected to one of the integrated circuits in the set of integrated circuits under test in each test channel; and
    (d) a controller in the test system, the controller connected and configured for successive selection of one of said plurality of test channels.

2. A test system comprising:
    (a) a plurality of test channels each receiving a plurality of integrated circuits under test;
    (b) a plurality of power modules, each connected to one of the integrated circuits under test in each test channel;
    (c) a controller connected and configured for successive selection of one of said plurality of test channels;
    in which said power modules each comprise a power input coupled to a device under test output by a switch, a microcontrol element coupled to a control terminal for said switch, a channel select multiplexer coupled to receive a control input from said microcontrol element, and a voltage and current multiplexer coupled to receive a control input from said microcontrol element, said channel select multiplexer being coupled to provide voltage and current measurements from a selected one of said integrated circuits under test to said voltage and current multiplexer, said voltage and current multiplexer being configured to supply the voltage and current measurements to said microcontrol element.

3. The test system of claim 2 in which said voltage and current multiplexer is coupled to receive the control input from said microcontrol element through an analog to digital converter.

4. The test system of claim 2 in which said switch is a metal oxide silicon field effect transistor switch.

5. The test system of claim 2 in which said switch comprises an adjustable voltage regulator.

* * * * *